United States Patent
Lee et al.

(10) Patent No.: US 6,321,451 B1
(45) Date of Patent: Nov. 27, 2001

(54) METHOD FOR MAKING A HEAT SINK

(75) Inventors: Shun-Jung Lee, Taipei; Hsieh-Kun Lee, Chung-Ho, both of (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/414,220

(22) Filed: Oct. 6, 1999

(30) Foreign Application Priority Data

Dec. 15, 1998 (TW) ................................................ 87120816

(51) Int. Cl.[7] ....................................................... B23P 15/26
(52) U.S. Cl. .................................. 29/890.03; 29/890.031; 165/80.3
(58) Field of Search ................ 29/890.03, 890.031, 29/505; 165/80.3, 185

(56) References Cited

U.S. PATENT DOCUMENTS

| | | | |
|---|---|---|---|
| 3,164,891 | * | 1/1965 | Gier, Jr. ............................ 29/890.03 |
| 3,404,446 | * | 10/1968 | Kritzger ............................ 29/890.03 |
| 5,014,776 | * | 5/1991 | Hess .................................. 29/890.03 |
| 5,419,041 | * | 5/1995 | Ozeki ................................ 29/890.03 |
| 5,533,257 | * | 7/1996 | Romero et al. ................... 29/890.03 |
| 5,558,155 | * | 9/1996 | Ito ..................................... 29/890.03 |
| 5,638,715 | * | 6/1997 | Lipinski ............................ 29/890.03 |
| 5,791,045 | * | 8/1998 | Yamamoto et al. .............. 29/890.03 |
| 5,819,407 | * | 10/1998 | terada ............................... 29/890.03 |
| 5,937,517 | * | 8/1999 | Smith et al. ...................... 29/890.03 |
| 6,085,830 | * | 7/2000 | Mashiko et al. .................. 29/890.03 |
| 6,134,783 | * | 10/2000 | Bargman et al. ................. 29/890.03 |
| 6,138,352 | * | 10/2000 | Smith et al. ...................... 29/890.03 |

* cited by examiner

*Primary Examiner*—I Cuda Rosenbaum
(74) *Attorney, Agent, or Firm*—Wei Te Chung

(57) ABSTRACT

A heat sink comprises a base plate and a plurality of heat dissipating fins upwardly extending from the base plate. Each fin includes a heat dissipating portion and a connecting portion integrated with the base plate by punching whereby concave sections are left in the connecting portion. The fins can be formed in various shapes by shearing and bending or by bending a metal sheet. A method for making a reliable heat sink includes a preparing step, a punching step and a flattening step. The preparing step comprises manufacturing a base plate and a plurality of fins each including a connecting portion and a heat dissipating portion. The punching step comprises punching the connecting portions of the fins against the base plate thereby integrating the connecting portions with the base plate, forming concave sections in the connecting portions and convex sections on an opposite lower surface of the base plate. The flattening step comprises flattening the convex sections of the base plate to maintain the planarity of the base plate.

1 Claim, 11 Drawing Sheets

METHOD FOR MAKING A HEAT SINK

BACKGROUND OF THE INVENTION

1. Field of the Invention

The present invention relates to a heat sink and a method for making the same, and particularly to a reliable heat sink with enhanced heat dissipating effectiveness and a method for making the same.

2. Description of Prior Art

As chips such as microprocessors contain more circuitry and operate at faster speeds, greater amounts of heat are generated, which must be effectively and timely dissipated, otherwise a malfunction or operational instability of the computer will result. Conventionally, a heat sink made from a heat conductive material, such as aluminum, is commonly used to remove the heat generated by a heat generating component, such as a CPU (central processing unit) or a chip in a computer. The heat sink is retained in direct contact with the heat generating component to dissipate the heat into the surrounding environment.

U.S. Pat. No. 5,038,858 discloses a conventional heat sink having a plurality of fins upwardly extending from a base plate thereof. The base plate is retained in direct contact with an upper surface of a chip to dissipate the heat into the surrounding environment via the fins. The fins are attached to the base plate by engaging with parallel grooves defined in the base plate. However, due to gaps inevitably defined between the fins and the base plate, the heat generated by the chip can not be effectively transmitted from the base plate to the fins, thereby significantly degrading the heat dissipating capability of the heat sink.

To overcome the above-mentioned problem, U.S. Pat. No. 5,625,229 discloses a heat sink which comprises a base plate and a corrugated heat dissipating member made of a thin metal. The heat dissipating member includes a repeated series of side wall portions, top walls and connecting portions. The heat dissipating member and the base plate are integrated with each other by bonding the connecting portions of the heat dissipating member with the base plate. Although no gap exists between the heat dissipating member and the base plate, the heat dissipating member and the base plate may separate from each other if the bond fails. In addition, since the adhesive is a material having poor heat conducting capability, the heat dissipating effectiveness of the heat sink is also degraded.

Therefore, an improved heat sink is desired which has fins and a base plate securely attached together thereby enhancing the heat dissipating effectiveness of the heat sink.

SUMMARY OF THE INVENTION

Accordingly, an object of the present invention is to provide a method for making a heat sink having fins and a base plate securely integrated with one another.

Another object of the present invention is to provide a heat sink having its fins and its base plate securely integrated with each other to enhance the heat dissipating effectiveness of the heat sink.

In order to achieve the objects set forth, a heat sink in accordance with the present invention comprises a base plate for contacting a heat generating component in a computer and a plurality of heat dissipating fins upwardly extending from the base plate. Each fin includes a heat dissipating portion and a connecting portion integrated with the base plate by punching whereby concave sections are left in the connecting portion. The fins can be formed in various shapes by shearing and bending or by bending a metal sheet.

A method for making a reliable heat sink of the present invention is also provided. The method includes a preparing step, a punching step and a flattening step. The preparing step comprises manufacturing a base plate and a plurality of fins each including a connecting portion and a heat dissipating portion. The punching step comprises punching the connecting portions of the fins against the base plate so that they integrate with the base plate in such manner that concave sections are left in the connecting portions and convex sections are left on a lower surface of the base plate. The flattening step comprises flattening the convex sections of the base plate to maintain planarity of the base plate. Using this method, the fins are securely integrated with the base plate thereby enhancing the heat dissipating effectiveness of the heat sink.

Other objects, advantages and novel features of the invention will become more apparent from the following detailed description when taken in conjunction with the accompanying drawings.

DETAILED DESCRIPTION OF THE EMBODIMENTS

Figure 1:
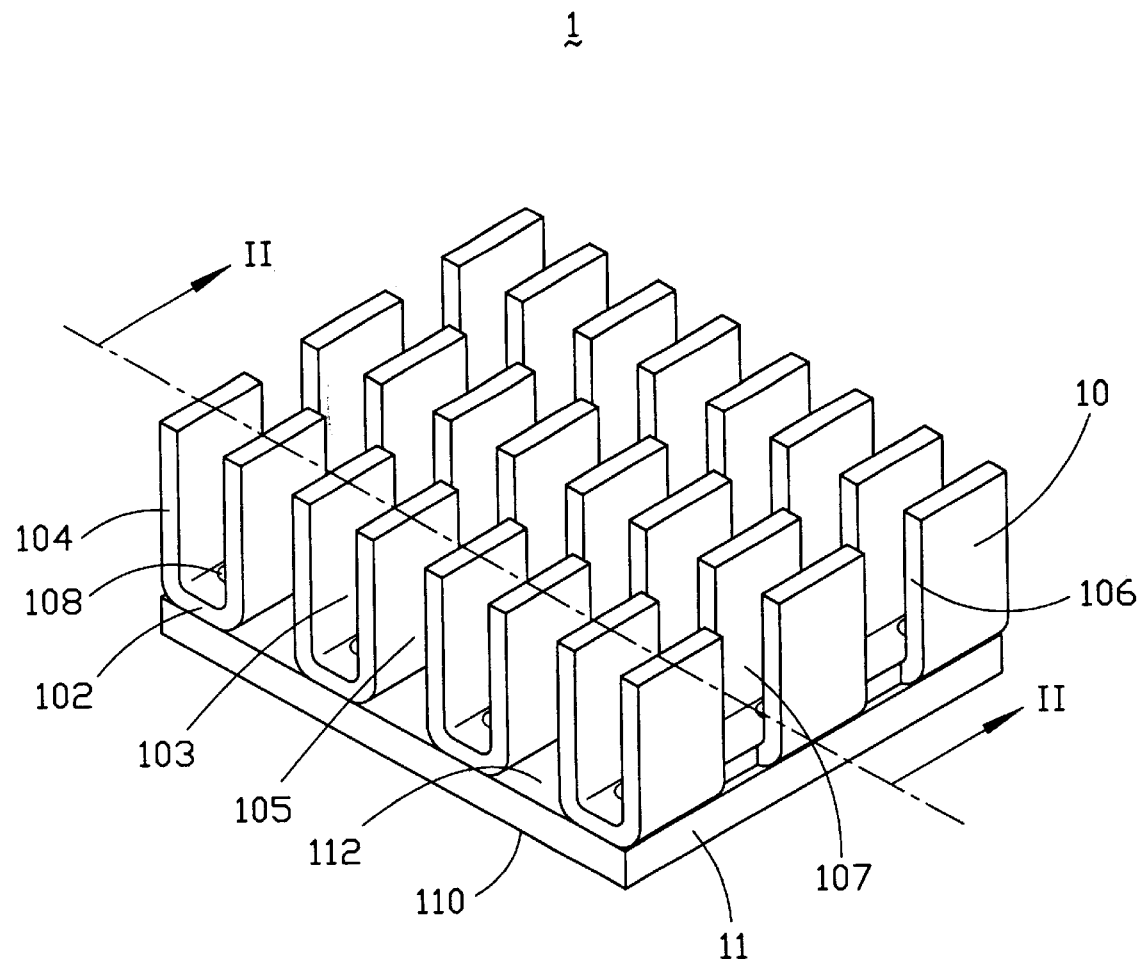
FIG. 1 is a perspective view of a heat sink in accordance with a first embodiment of the present invention.

For facilitating understanding, like components are designated by like reference numerals throughout the various embodiments of the invention as shown in the various drawing figures.

Reference will now be made to the drawing figures to describe the present invention in detail.

Referring to FIG. 1, a heat sink 1 in accordance with a first embodiment of the present invention comprises a flat base plate 11 and a plurality of heat dissipating fins 10 upwardly extending from the base plate 11. The base plate 11 and the fins 10 are made from a heat conductive material such as aluminum and are integrated with each other by punching.

The base plate 11 has a lower surface 110 for contacting a heat generating component in a computer and an upper surface 112 for disposing the fins 10. The fins 10 are formed by shearing and bending and are arranged in rows. Each fin 10 has a U-shaped cross section forming a connecting portion in the form of a strip 102 and a heat dissipating portion in the form of a pair of opposite side walls 104. The opposite side walls 104 of each fin 10 define a first channel 103 in a transverse direction of the heat sink 1. A second channel 105 is defined between adjacent rows of fins 10 in a direction parallel with the first channel 103. The fins 10 comprise cutouts 106 formed in the side walls 104 to define a third channel 107 in a longitudinal direction of the heat sink 1 intersecting the first and the second channels 103 and 105. The channels 103, 105 and 107 facilitate air convection thereby providing the heat sink 1 with enhanced heat dissipating capability.

Figure 2:
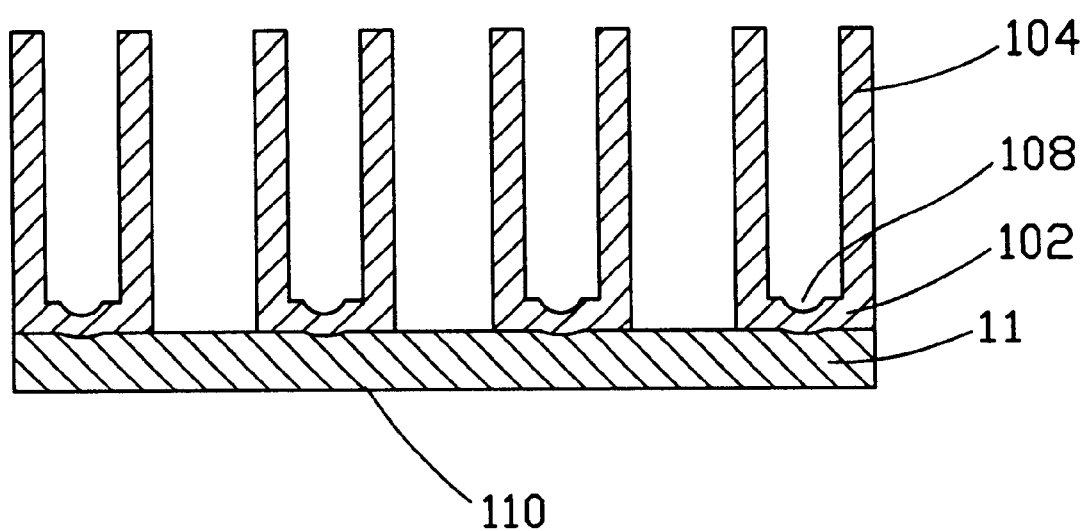
FIG. 2 is a cross-sectional view taken along line II—II of FIG. 1.

Also referring to FIG. 2, after the fins 10 are arranged on the upper surface 112 of the base plate 11, the strips 102 of the fins 10 are punched to be integrated with the base plate 11 by an external tool. Thus, the fins 10 are securely integrated with the base plate 11 whereby concave sections 108 are left in the strip 102 of each fin 10 and convex sections (not shown) protrude from the lower surface 110 of the base plate 11. The convex sections are removed in a final step to maintain the planarity of the base plate 11 thereby enabling an intimate contact with a heat generating component.

Figure 3:
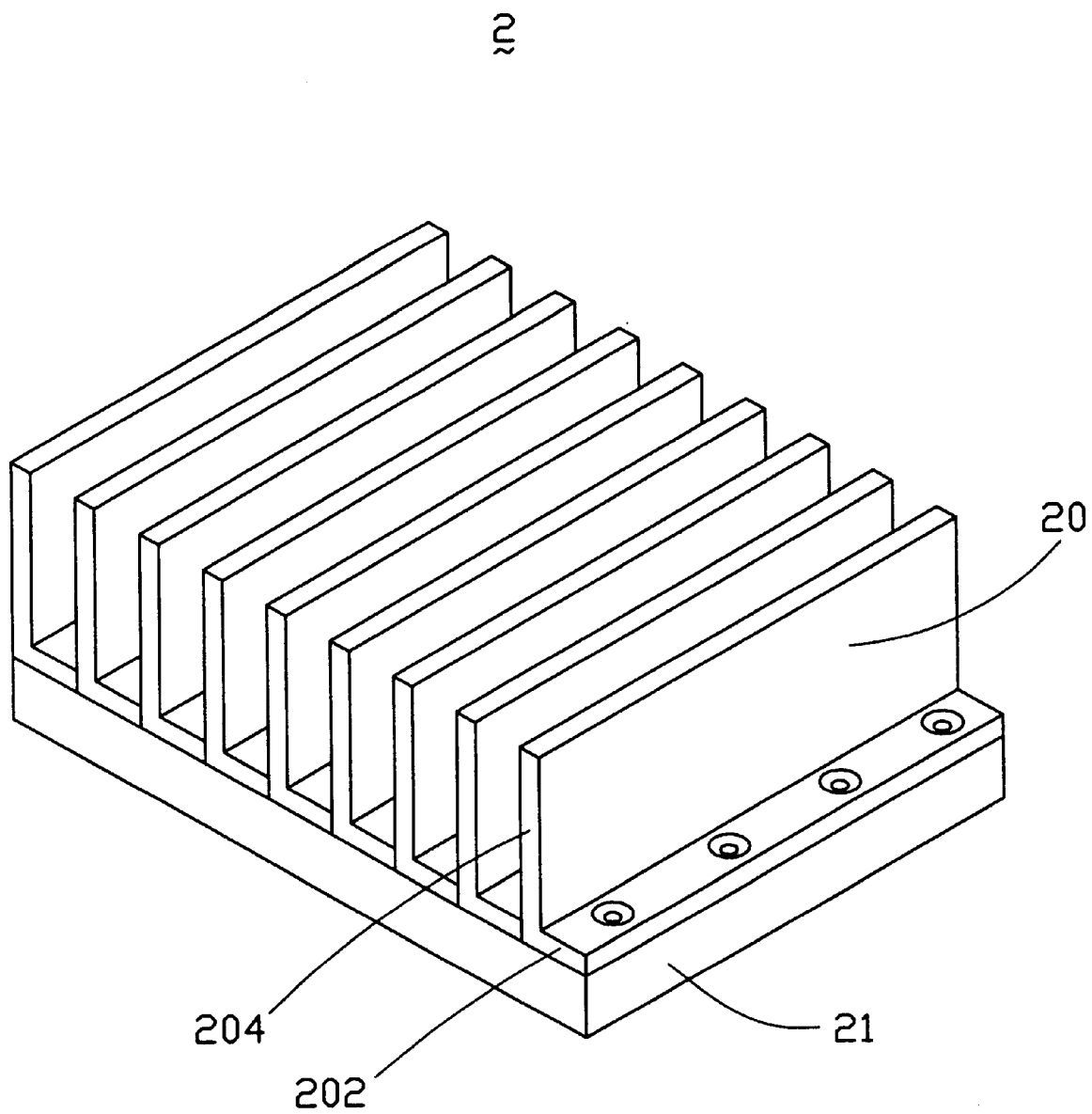
FIG. 3 is a perspective view of a heat sink in accordance with a second embodiment of the present invention.

FIG. 3 shows a heat sink 2 in accordance with a second embodiment of the present invention. The heat sink 2 comprises a base plate 21 and a plurality of parallel fins 20. Each fin 20 has an L-shaped cross section and is formed by bending. Each fin 20 includes a connecting portion in the form of a strip 202 and a heat dissipating portion in the form of a vertical wall 204. The strips 202 of the fins 20 are securely integrated with the base plate 21 by punching.

Figure 4:
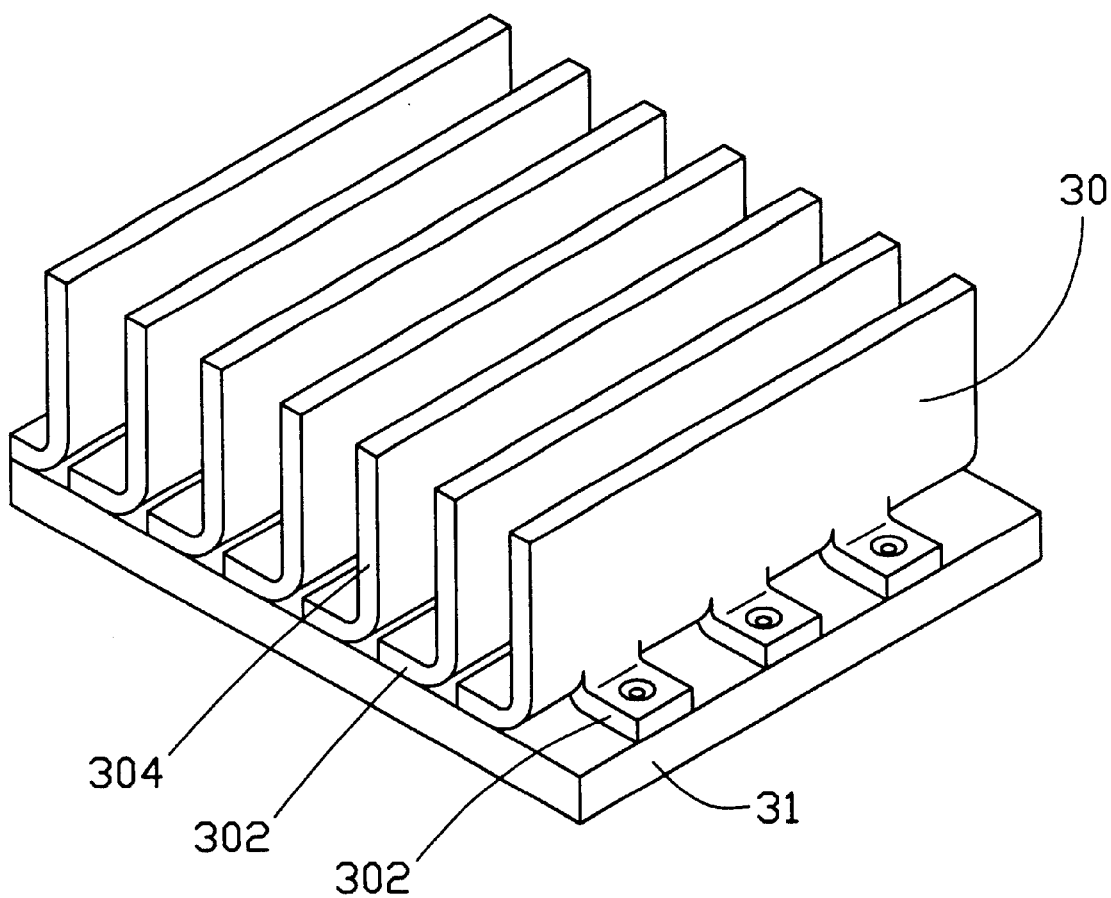
FIG. 4 is a perspective view of a heat sink in accordance with a third embodiment of the present invention.
Figure 5:
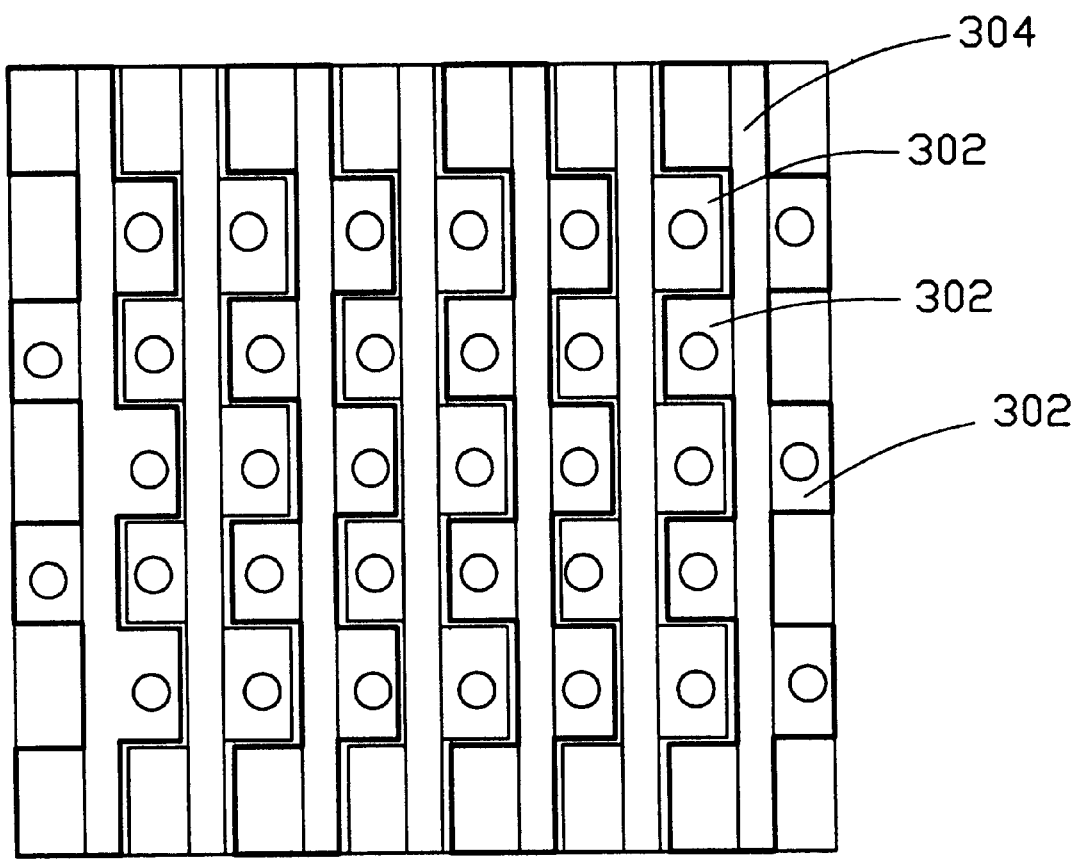
FIG. 5 is a top plan view of the heat sink of FIG. 4.

A heat sink 3 in accordance with a third embodiment of the present invention is shown in FIGS. 4 and 5. The heat sink 3 includes a base plate 31 and a plurality of fins 30 formed by shearing and bending. Each fin 30 includes a heat dissipating portion in the form of a central vertical wall 304 and a connecting portion in the form of a plurality of tabs 302 extending from opposite sides of the vertical wall 304 in a staggered manner. The tabs 302 of the fins 30 are securely integrated with the base plate 31 by punching whereby the staggered tabs 302 of adjacent fins 30 are engaged with each other, as best shown in FIG. 5.

Figure 6:
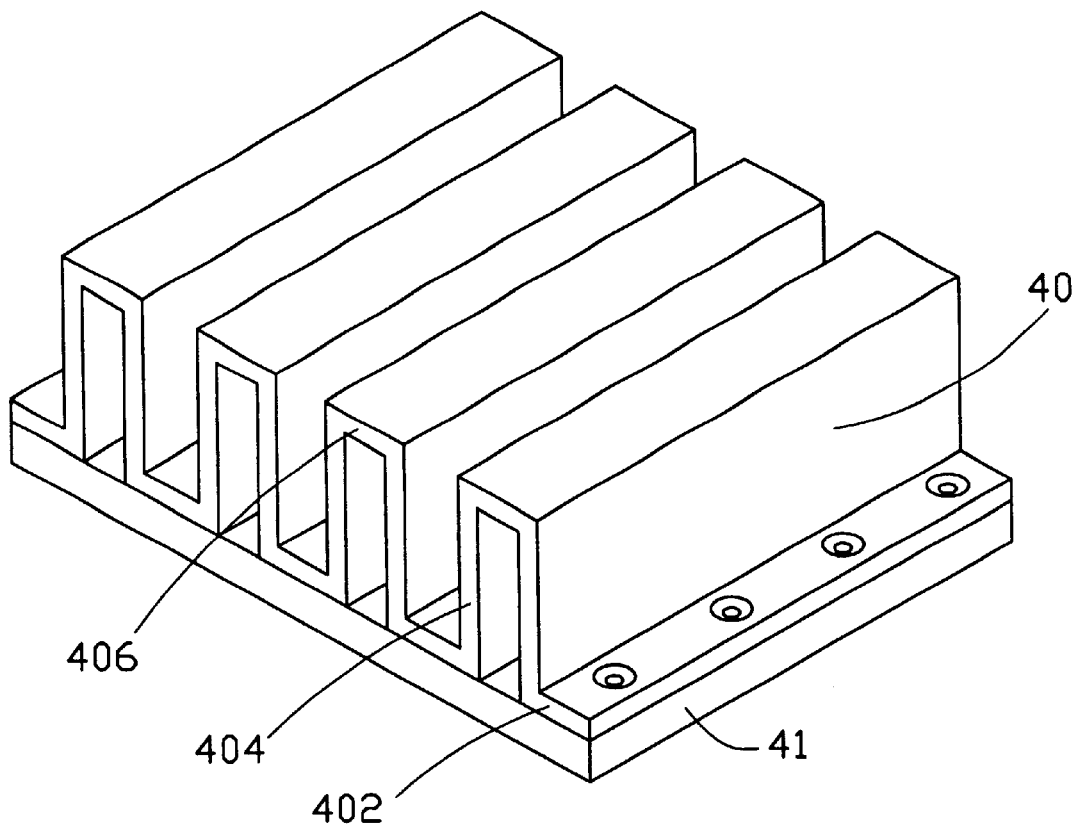
FIG. 6 is a perspective view of a heat sink in accordance with a fourth embodiment of the present invention.

As shown in FIG. 6, a heat sink 4 in accordance with a fourth embodiment of the present invention comprises a base plate 41 and a corrugated heat dissipating member having a plurality of fins 40 formed by bending a metal sheet. The heat dissipating member includes a repeated series of side walls 404, top walls 406 interconnecting top ends of every pair of adjacent side walls 404, and strips 402 interconnecting bottom ends of every alternate pair of adjacent side walls 404 in a staggered manner relative to the top walls 406. The side walls 404 and the top walls 406 act as heat dissipating portions and the strips 402 act as connecting portions. The strips 402 of the heat dissipating member and the base plate 41 are securely integrated with each other by punching.

Figure 7:
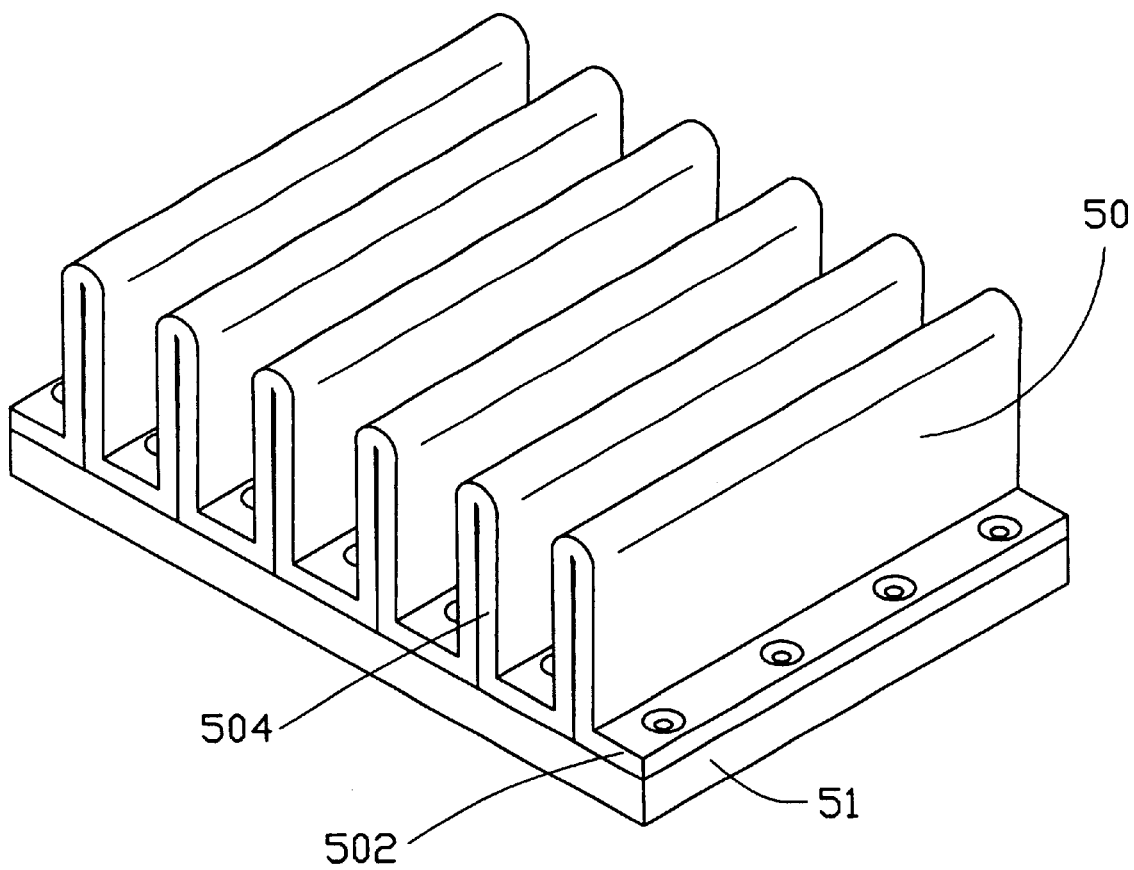
FIG. 7 is a perspective view of a heat sink in accordance with a fifth embodiment of the present invention.

FIG. 7 shows a heat sink 5 in accordance with a fifth embodiment of the present invention. The heat sink 5 comprises a base plate 51 and a heat dissipating member having a plurality of folded fins 50 formed by bending a metal sheet. The heat dissipating member includes a repeated series of strips 502 acting as connecting portions and side walls 504 acting as heat dissipating portions. Every pair of adjacent side walls 504 are folded to abut against each other and the strips 502 interconnect bottom ends of every alternate pair of spaced side walls 504. The connecting portions 502 of the heat dissipating member and the base plate 51 are securely integrated with each other by punching.

Figure 8:
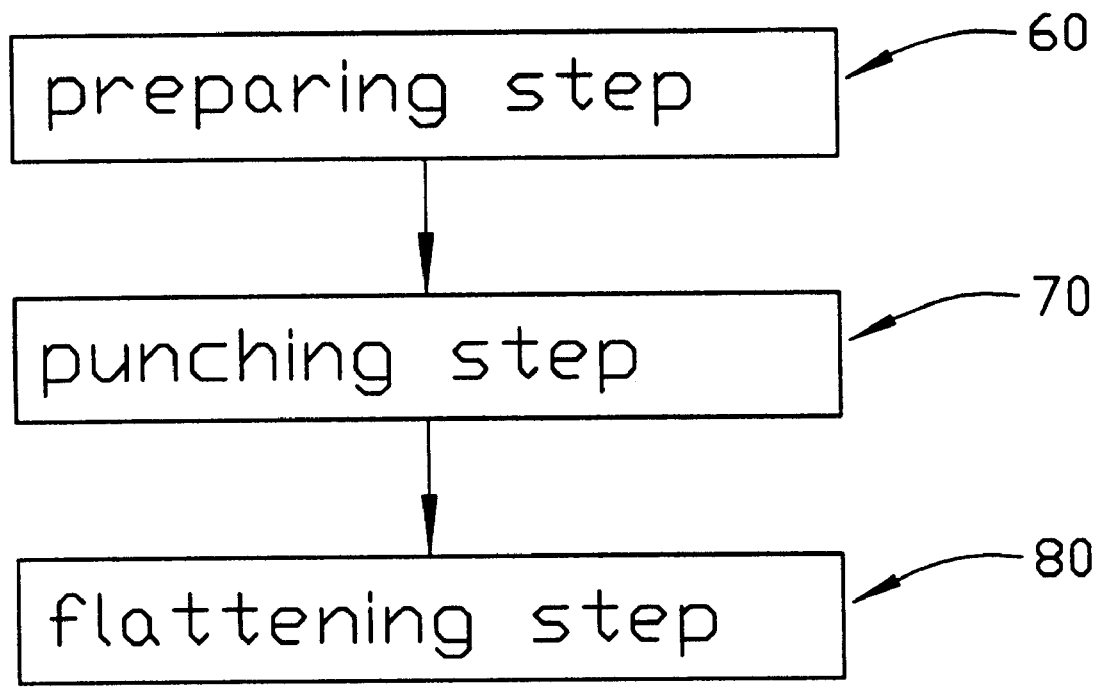
FIG. 8 is a flow chart illustrating the steps of making a heat sink in accordance with the present invention.

A method for making a reliable heat sink in accordance with the present invention is also provided. FIG. 8 shows a flow chart illustrating the sequential process for making heat sinks of the present invention. The process includes a preparing step 60, a punching step 70 and a flattening step 80 as respectively illustrated in FIGS. 9A–9E, which will be described in detail hereafter.

Figure 9A:
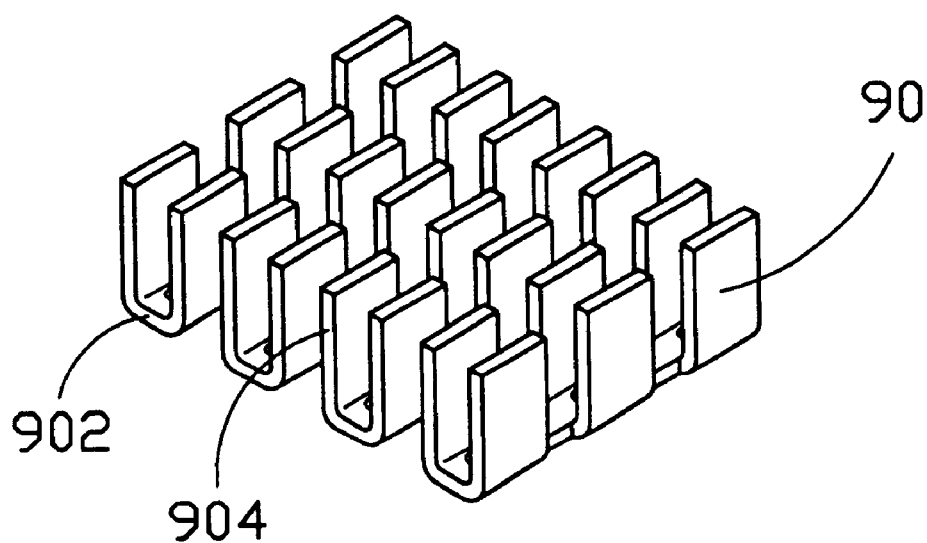
FIGS. 9A, 9B and 9D are isometric views sequentially illustrating the steps of making a heat sink in accordance with the present invention.
Figure 9A:
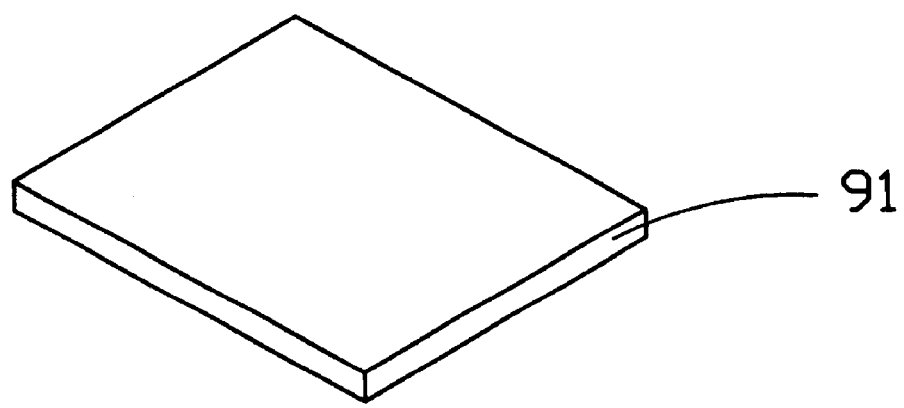
Figure 9B:
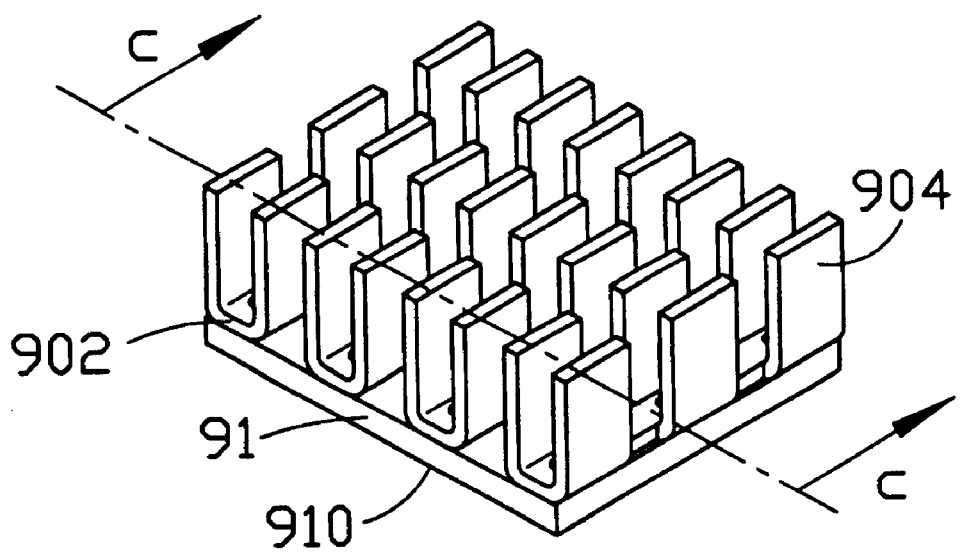
Figure 9C:
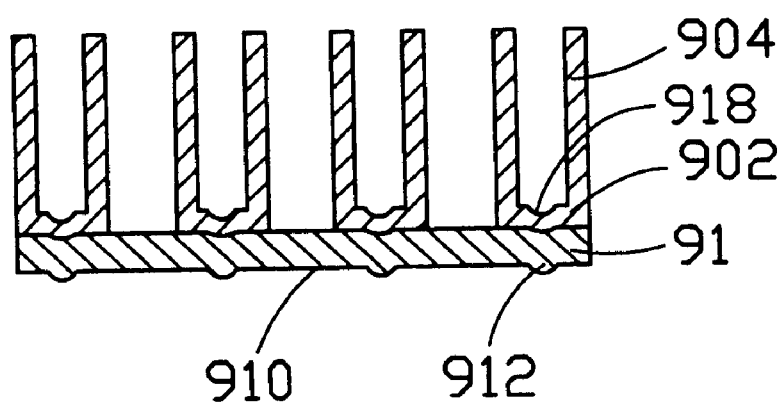
FIG. 9C is a cross-sectional view taken along line C—C of FIG. 9B.
Figure 9D:
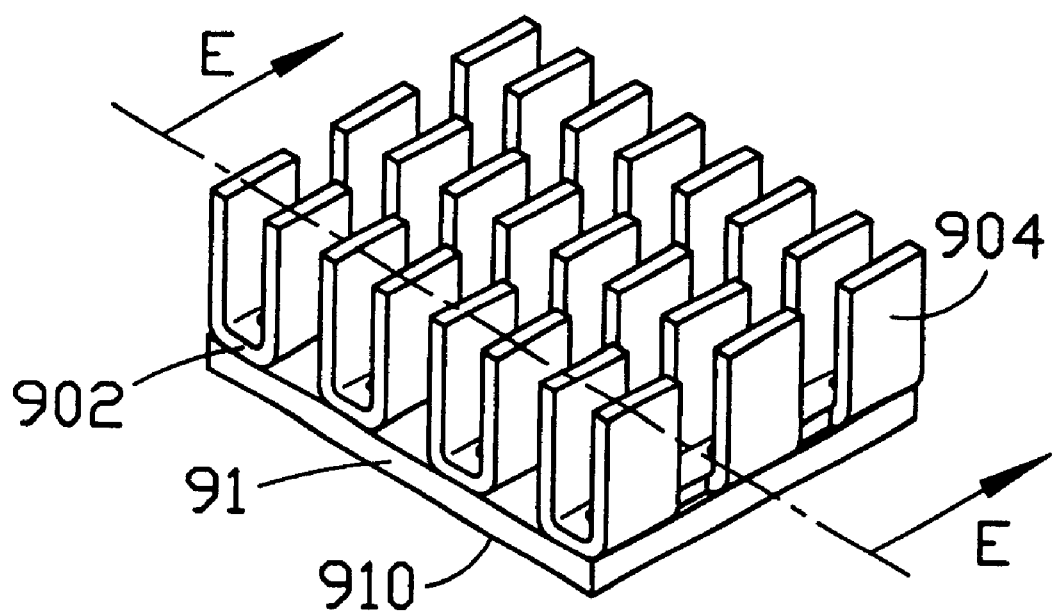
Figure 9E:
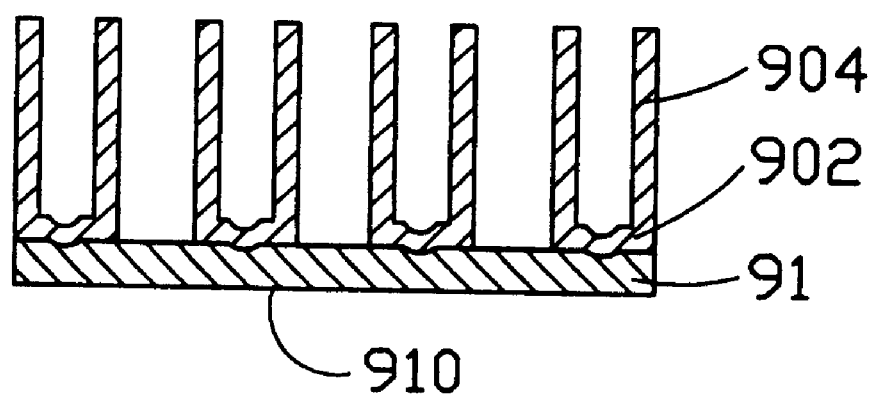
FIG. 9E is a cross-sectional view taken along line E—E of FIG. 9D.

Referring to FIG. 9A, the preparing step 60 comprises providing a base plate 91 and a plurality of fins 90 each having a connecting portion 902 and a heat dissipating portion 904. The punching step 70 comprises punching the connecting portions 902 of the fins 90 against the base plate 91 thereby securely integrating the fins 90 with the base plate 91. This step produces concave sections 918 in each connecting portion 902 and convex sections 912 projecting from corresponding locations on a lower surface 910 of the base plate 91, as shown in FIGS. 9B and 9C. The flattening step 80 is illustrated in FIGS. 9D and 9E, which comprises flattening the convex sections 912 of the base plate 91 to maintain planarity of the lower surface 910 thereby ensuring an intimate contact with a heat generating component in a computer. Using this method, the fins 90 are securely integrated with the base plate 91 thereby enhancing the heat dissipating effectiveness of the heat sink.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A method for making a heat sink comprising the steps of:
   a) preparing a base plate and a plurality of fins, each fin being formed with a connecting portion and a heat dissipating portion, wherein the fins are sheared and bent to have a U-shaped cross section having a pair of side walls for acting as the heat dissipating portion and a strip interconnecting side walls for acting as the connecting portion, and wherein each side wall is formed with cutouts transverse to the extending direction of the fin;
   b) punching the connecting portions of the fins against the base plate to integrate the fins with the base plate whereby concave sections are left in each connecting portion and convex sections project from corresponding locations of a lower surface of the base plate; and
   c) flattening the convex sections of the base plate to maintain a planarity of the lower surface of the base plate.

\* \* \* \* \*